United States Patent
Weijers et al.

(10) Patent No.: US 7,994,530 B2
(45) Date of Patent: Aug. 9, 2011

(54) LIGHT EMITTING DIODE MODULE

(75) Inventors: Aldegonda Lucia Weijers, Eindhoven (NL); Martijn Henri Richard Lankhorst, Eindhoven (NL); Lingli Wang, Eindhoven (NL); Teunis Willem Tukker, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 319 days.

(21) Appl. No.: 12/281,161

(22) PCT Filed: Feb. 22, 2007

(86) PCT No.: PCT/IB2007/050567
§ 371 (c)(1),
(2), (4) Date: Aug. 29, 2008

(87) PCT Pub. No.: WO2007/102095
PCT Pub. Date: Sep. 13, 2007

(65) Prior Publication Data
US 2009/0050919 A1    Feb. 26, 2009

(30) Foreign Application Priority Data
Mar. 6, 2006   (EP) ..................... 06110704

(51) Int. Cl.
*H01L 29/04* (2006.01)
*H01L 31/036* (2006.01)
*H01L 27/15* (2006.01)
*H01L 33/00* (2006.01)
*H01L 31/21* (2006.01)

(52) U.S. Cl. .................. 257/98; 257/79; 257/72; 257/59
(58) Field of Classification Search .................... 257/88, 257/89, 59, 79, 57, 83, 257, 290, 351, 368, 257/390, 252, 258
See application file for complete search history.

(56) References Cited

U.S. PATENT DOCUMENTS

| | | | |
|---|---|---|---|
| 6,357,889 B1 | 3/2002 | Duggal et al. | |
| 6,812,500 B2 | 11/2004 | Reeh et al. | |
| 2005/0041424 A1 | 2/2005 | Ducharme | |
| 2005/0184638 A1 | 8/2005 | Mueller et al. | |
| 2005/0269582 A1 | 12/2005 | Mueller et al. | |
| 2006/0250069 A1* | 11/2006 | Sakata et al. | 313/485 |

FOREIGN PATENT DOCUMENTS

| | | | |
|---|---|---|---|
| DE | 10349038 A1 | 5/2004 | |
| EP | 1588991 A1 | 10/2005 | |
| JP | 10269822 A | 10/1998 | |
| WO | 2004060024 A1 | 7/2004 | |
| WO | 2004097949 A1 | 11/2004 | |

* cited by examiner

Primary Examiner — Chuong A. Luu

(57) ABSTRACT

The present invention relates to a light emitting diode (LED) module (10), comprising at least one LED chip (12) having a surface (13) for emitting light, and a ceramic conversion plate (14). The LED module is characterized in that the ceramic conversion plate includes a first segment (18) covering a first portion of the light emitting surface of the LED chip(s) and a second segment (20) provided alongside the first segment covering a second portion of the light emitting surface of the LED chip(s), wherein at least one of the segments comprises a wavelength-converting material for converting light emitted from the LED chip(s) to a certain wavelength. The present invention also relates to a method for the manufacturing of such an LED module, and a ceramic conversion plate for use in an LED module.

7 Claims, 2 Drawing Sheets

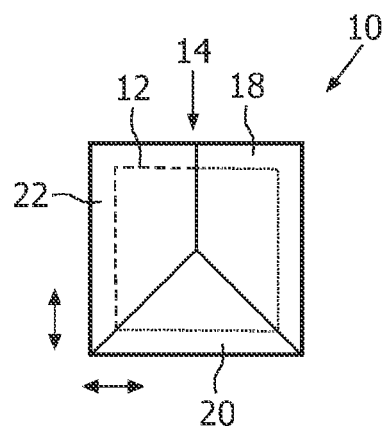 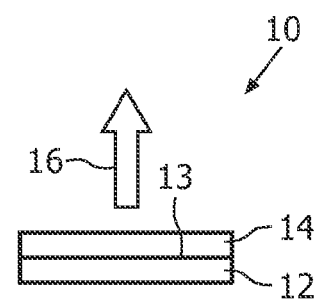
FIG. 1a　　　　　　　　FIG. 1b
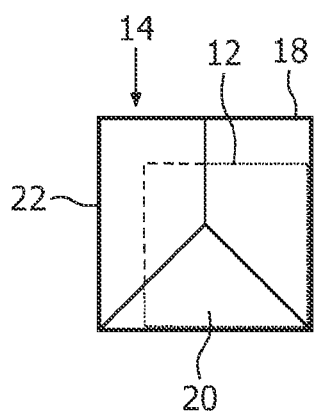 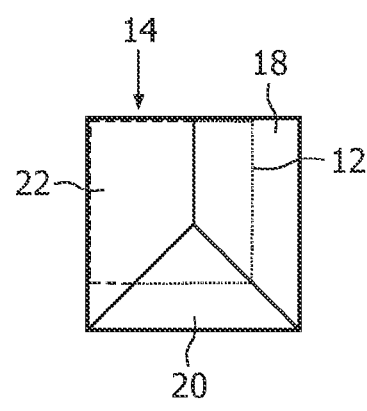
FIG. 1c　　　　　　　　FIG. 1d
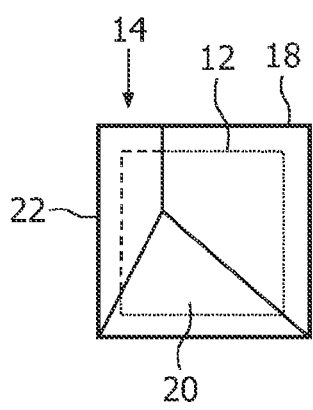 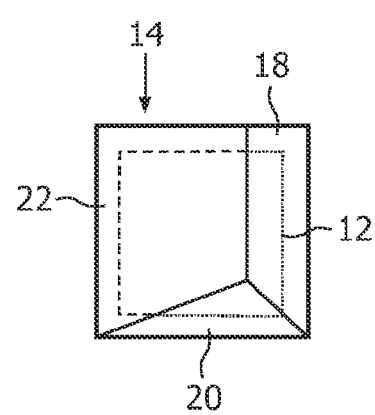
FIG. 1e　　　　　　　　FIG. 1f

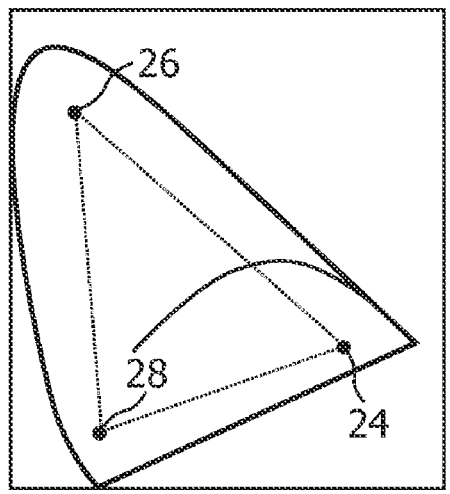
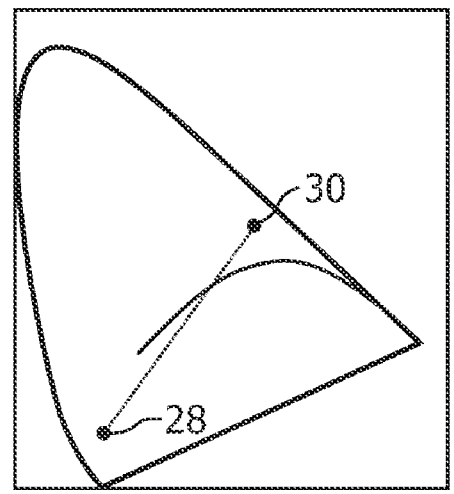
FIG. 2a    FIG. 2b
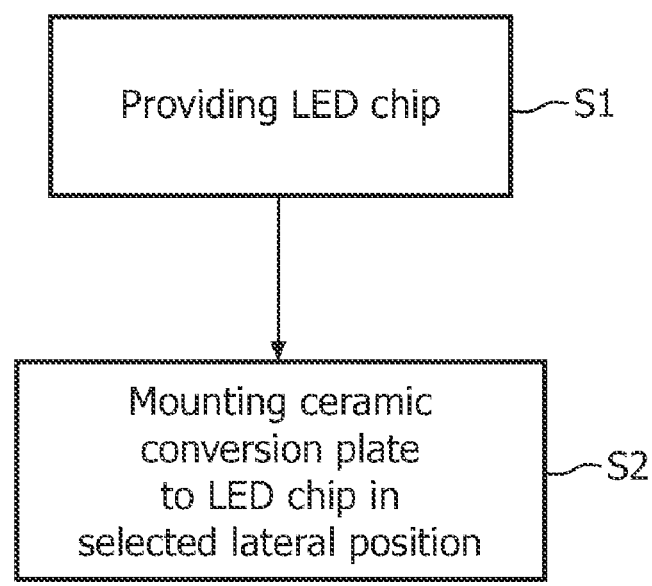
FIG. 3

LIGHT EMITTING DIODE MODULE

The present invention relates to a light emitting diode (LED) module comprising at least one LED chip and a ceramic conversion plate. The present invention also relates to a method for the manufacturing of such an LED module, and a ceramic conversion plate for use in an LED module.

It is well known in prior art that light of a first (peak) wavelength can be converted into light of a longer (peak) wavelength using a process known as luminescence/fluorescence. The fluorescent process involves absorbing the light having the first wavelength by a wavelength-converting material such as a phosphor, exciting the luminescent centers of the phosphor material, which emit the light of the longer wavelength. This process is used, for example, in LEDs to generate white light, wherein emission from a blue LED chip is partly converted to yellow/orange by an overlying phosphor layer, whereby unconverted blue light and converted yellow/orange light mix to white light.

A recent development in the area of such so called phosphor converted LEDs comprises using a ceramic layer as the overlying phosphor layer, as disclosed in the document US2005/0569582. In US2005/0569582, a light emitting layer is combined with a ceramic layer which is disposed in the path of the light emitted by the light emitting layer. The ceramic layer is composed of or includes a wavelength-converting material such as a phosphor. The ceramic layer may be more robust and less sensitive to temperature than other prior art phosphor layers, which typically comprise a transparent resin, silicone gel, or similar including wavelength-converting material.

US2005/0569582 further discloses an embodiment in which an additional ceramic layer is placed on top of the first ceramic layer, i.e. the two ceramic layers are stacked over the light emitting layer. The two ceramic layers can comprise different phosphors. The arrangement of the different phosphors in the two ceramic layers or the two ceramic layers themselves may be chosen to control the interaction between the multiple phosphors in the LED module, so that a certain color point can be provided.

However, a drawback with the stacked structure disclosed in US2005/0569582 is that a ceramic layer combination having specific properties (such as certain phosphor concentrations and/or a certain thickness of the layers) must be produced for each desired overall color point. Further, when one ceramic layer is covered by another ceramic layer, the optical path length of a light beam from the light emitting layer depends on the direction of the beam. This means that the color of the light depends on the viewing angle, which of course can be unfavorable for certain applications. Also, the order of the ceramic layers must be carefully selected so that light from the ceramic layer closest to the light emitting layer is not absorbed by the next overlying ceramic layer. Also, the stacked structure results in a device having a significant height or thickness.

It is an object of the present invention to overcome these problems at least partially, and to provide an improved LED module.

This and other objects that will be evident from the following description are achieved by means of an LED module, a method for the manufacturing of such an LED module, and a ceramic conversion plate for use in an LED module, according to the appended claims.

According to one aspect of the invention, there is provided an LED module comprising at least one LED chip having a surface for emitting light, and a ceramic conversion plate, characterized in that the ceramic conversion plate includes a first segment covering a first portion of the light emitting surface of the LED chip(s) and a second segment provided alongside the first segment covering a second portion of the light emitting surface of the LED chip(s), wherein at least one of the segments comprises a wavelength-converting material for converting light emitted from the LED chip(s) to a certain wavelength.

By dividing the ceramic conversion plate into segments placed side by side, i.e. in the same level, instead of placing ceramic layers on top of each other, the thickness of the device as well as the color variation over the viewing angle can be reduced. Also, since the segments are placed on the LED chip side by side, there is little or no risk that light from one segment enters another segment and possibly gets absorbed. Further, dividing the conversion plate into lateral segments is made possible, or at least facilitated, by the fact that the ceramic conversion plate is a solid state conversion plate.

In one embodiment, the first segment comprises a first wavelength-converting material for converting light emitted from the LED chip(s) to a first wavelength and the second segment comprises a second wavelength-converting material for converting light emitted from the LED chip(s) to a second wavelength. Additionally, the ceramic conversion plate can further include a third segment provided alongside the first segment and/or the second segment and covering a third portion of the light emitting surface of the LED chip(s). The third segment can comprise, for example, a third wavelength-converting material for converting light emitted from the LED chip(s) to a third wavelength. An example of such an LED module comprises at least one LED chip adapted to emit UV radiation, the first segment adapted to convert UV radiation to red light, the second segment adapted to convert UV radiation to green light, and the third segment adapted to convert UV radiation to blue light, whereby the mixed red, green, and blue light produces a whitish light. Alternatively, the third segment can comprise a non wavelength-converting material, i.e. a "transparent" segment. An example of such an LED module comprises at least one LED chip adapted to emit blue light, the first segment adapted to convert blue light to red light, and the second segment adapted to convert blue light to green light, whereby the mixed blue light (transmitted from the LED chip(s) through the "transparent" third segment), red light and green light produces a whitish light.

In another embodiment, the first segment comprises a first wavelength-converting material for converting light emitted from the LED chip(s) to a first wavelength, whereas the second segment comprises a non wavelength-converting material. For example, the at least one LED chip can be adapted to emit blue light, and the first segment can be adapted to convert blue light to yellow light, whereby the mixture of blue light (transmitted from the LED chip(s) through the "transparent" second segment) and yellow light produces a whitish light.

Further, by appropriately selecting the lateral position of the conversion plate in relation to the LED chip(s), mixed light of a certain desired color can be produced. For example, the ceramic conversion plate can be laterally shifted over the LED chip(s), so that the amount of blue, red, green and/or yellow is changed, which in turn changes the color point of the produced mixed light. In this case, a ceramic conversion plate having a single configuration can be used in the manufacturing of LED modules with different color points (simply by selecting a lateral position of the ceramic conversion plate which corresponds to the desired color point), which is very beneficial from a manufacturing point of view. Further, a wide variety of color points can be selected with this configuration.

As an alternative, or as a complement, by appropriately selecting the size of the segment, the color of the mixed light can also be affected. For example, the size of the red or green or yellow segments as discussed can be increased, whereby a larger portion of the (blue) light emitted from the LED chip(s) is converted, resulting in a decreased color temperature of the produced mixed light.

According to another aspect of the present invention, there is provided a ceramic conversion plate for use in a light emitting diode module comprising at least one LED chip having a surface for emitting light, which ceramic conversion plate includes a first segment adapted to cover a first portion of the light emitting surface of the LED chip(s), and a second segment provided alongside the first segment and adapted to cover a second portion of the light emitting surface of the LED chip(s), wherein at least one of the segments comprises a wavelength-converting material for converting light emitted from the LED chip(s) to a certain wavelength. This ceramic conversion plate offers similar advantages to those obtained with the previously discussed aspect of the invention.

According to yet another aspect of the present invention, there is provided a method for the manufacturing of a light emitting diode (LED) module, which method comprises providing at least one LED chip having a surface for emitting light, and mounting a ceramic conversion plate onto the LED chip(s), which plate includes a first segment adapted to cover a first portion of the light emitting surface of the LED chip(s) and a second segment provided alongside the first segment and adapted to cover a second portion of the light emitting surface of the LED chip(s), wherein at least one of the segments comprises a wavelength-converting material for converting light emitted from the LED chip(s) to a certain wavelength. Preferably, the step of mounting the ceramic conversion plate comprises selecting at least one of the lateral positions of the conversion plate in relation to the LED chip(s) and the size of the segments, so that the LED module produces mixed light of a certain desired color. This method for the manufacturing of an LED module offers similar advantages to those obtained with the previously discussed aspects of the invention.

These and other aspects of the present invention will now be described in more detail, with reference to the appended drawings showing a currently preferred embodiment of the invention.

FIGS. 1a-1f illustrate an LED module according to embodiments of the invention, and FIGS. 2a-2b are CIE chromaticity diagrams for the LED module shown in FIGS. 1a-1f and a prior art LED module, respectively, and FIG. 3 is a flow chart of a method for the manufacturing of an LED module according to the invention.

FIGS. 1a-1f illustrate an LED module 10 according to embodiments of the invention. FIG. 1a is a top view and FIG. 1b is a side view of a basic configuration of the LED module 10. The LED module 10 comprises an LED chip 12. The LED chip has a light emitting surface 13, here the top surface of the LED chip 12. The LED module 10 further comprises a ceramic conversion plate 14 for converting light emitted from the LED chip 12. The ceramic conversion plate 14 is disposed in a path of light (indicated by arrow 16 in the FIG. 1b) emitted from the LED chip 12, namely the ceramic conversion plate 14 is placed on top of the LED chip 12. The shape of the ceramic conversion plate 16 essentially corresponds to the square shape of the LED chip 12. The ceramic conversion plate 14 can be of a similar material to that of the ceramic layers in US2005/0569582 mentioned above.

According to an embodiment of the invention, the ceramic conversion plate includes a first segment 18 covering a first portion of the light emitting surface 13 of the LED chip 12, a second segment 20 provided alongside the first segment 18 covering a second portion of the light emitting surface 13 of the LED chip 12, and a third segment 22 provided alongside the first and second segments 18, 20 covering a third portion of the light emitting surface 13 of the LED chip 12. In FIGS. 1a-1f, the segments are shaped such that borders having the shape of an upside down "Y" are formed. However, the segments may have other shapes. For example, the segments can have rectangular shapes and be arranged such that borders having the shape of a "T" are formed (not shown).

The first segment 18 comprises a first wavelength-converting material, such as a phosphor, for converting light emitted from the LED chip 12 to a first wavelength, the second segment 20 comprises a second wavelength-converting material for converting light emitted from the LED chip 12 to a second wavelength, and the third segment 22 comprises a non wavelength-converting material, i.e. a "transparent" material. For example, the LED chip 12 can be adapted to emit blue light, the first segment 18 can be adapted to convert blue light into red light, and the second segment 20 can be adapted to convert blue light into green light. Thus, during operation, converted red light from the first segment 18 and converted green light from the second segment 20 is mixed with unconverted blue light emitted from the LED chip 12 through the "transparent" third segment 22, whereby an overall whitish light is produced.

In FIGS. 1a-1b, the sizes of the segments 18, 20, 22 are essentially equal, and the ceramic conversion plate 14 is positioned centered on the LED chip 12, yielding a mixed light having a certain color point. However, in order to provide a different color point, i.e. tune the LED module 10, this can be achieved by altering at least one of the lateral positions of the ceramic conversion plate 14 in relation to the LED chip 12 and the sizes of the segments 18, 20, 22.

In FIG. 1c, the lateral position of the ceramic conversion plate 14 is shifted upwards and to the left. In this case, a larger portion of the LED chip 12 is covered by the first and second segments 18, 20, whereby a larger part of the blue light emitted from the LED chip will be absorbed and converted into read and green, respectively, resulting in a decreased color temperature of the mixed light. On the contrary, in FIG. 1d, the lateral position of the ceramic conversion plate 14 is shifted downwards and to the right. In this case, a larger portion of the LED chip 12 is covered by the "transparent" third segment 22, whereby less blue light emitted from the LED chip is converted into red and green, resulting in an increased color temperature of the mixed light. In FIGS. 1c-1d, the area of the ceramic conversion plate 14 is preferably somewhat larger than the area of the LED chip 12.

Thus, the color point of the LED module 10 can be tuned by laterally shifting the ceramic conversion plate 14 in relation to the LED chip 12, and a certain white color can be obtained essentially irrespectively of the emission spectrum of the blue LED chip 12, as long as the emission spectrum of the blue LED chip 12 has sufficient overlap with absorption spectrums of the phosphors of the segments 18, 20. This can be explained by looking at the CIE chromaticity diagram in FIG. 2a, wherein the phosphors in the segments 18, 20 emit light with color coordinates 24, 26 that are red and green, respectively. The triangle determined by these two color coordinates and the color coordinate 28 of the blue LED chip 12 indicates which colors that can be reached by the LED module according to this embodiment of the invention, by for example laterally shifting the ceramic conversion plate 14 in relation to the LED chip 12. Further, FIG. 2b illustrates a CIE chromaticity diagram for a prior art LED module wherein emission from a blue LED chip is partly converted into yellow/orange by an overlying phosphor layer. With this LED module, the color that can be obtained are on a line between the color coordinate 28 of the blue LED chip and the color coordinate 30 of the yellow/orange phosphor. Clearly, the LED module according to this embodiment of the invention offers a greater possibility to select the overall color point than the prior art LED module.

As an alternative or complement to laterally shifting the ceramic conversion plate 14 in relation to the LED chip 12, the size of the segments 18, 20, 22 can be altered. In FIG. 1e, the size of the red and green segments 18, 20 is increased while the size of the transparent segment 22 is decreased, whereby a larger part of the blue light emitted from the LED chip will be absorbed and converted into read and green, respectively, resulting in a decreased color temperature of the mixed light. On the contrary, in FIG. 1f, the size of the red and green segments 18, 20 is decreased while the size of the transparent segment 22 is increased, whereby more blue light emitted from the LED chip will be emitted without conversion, resulting in an increased color temperature of the mixed light.

Selecting the lateral position of the ceramic conversion plate 14 in relation to the LED chip 12 and/or sizing of the segments 18, 20, 22 is preferably carried out during manufacturing of the LED module 10. The former option offers a significant advantage in that ceramic conversion plates all having the same configuration can be used in the manufacturing of a LED module with different color points of the overall mixed radiation, simply by laterally shifting the ceramic conversion plate in relation to the LED chip depending on the desired color point, as explained above.

An exemplary method for the manufacturing of an LED module according to the invention is summarized in the flow chart of FIG. 3. The method comprises the steps of providing the blue LED chip 12 (S1), and mounting the ceramic conversion plate 14 onto the LED chip 12 (S2), wherein the lateral position of the ceramic conversion plate 14 in relation to the LED chip 12 is selected, so that the LED module 10 produces mixed light of a certain desired color.

Applications of the LED module according to the invention includes LCD monitors or LCD televisions, general lighting applications, beamers, direct view applications, etc.

The person skilled in the art realizes that the present invention is by no means limited to the preferred embodiment described above. On the contrary, many modifications and variations are possible within the scope of the appended claims. For example, even though a ceramic conversion plate having two color converting segments has been discussed, the ceramic conversion plate could have only one color converting segment or more than two color converting segments. For example yellow of cyan segments could be added. Further, even though only one LED chip is shown in FIGS. 1a-1f, the LED module of the invention can comprise several LED chips placed adjacent to each other, in which case the ceramic conversion plate is adapted to cover the several adjacent LED chips. Also, the ceramic conversion plate could additionally be rotated to change the amount of colors (for example blue, red and green) and thus the color point of the overall mixed light.

The invention claimed is:

1. Light emitting diode (LED) module, comprising:
   at least one LED chip having a surface for emitting light, and
   a ceramic conversion plate,
   characterized in that the ceramic conversion plate includes a first segment covering a first portion of the light emitting surface of the LED chip(s) and a second segment provided alongside the first segment covering a second portion of the light emitting surface of the LED chip(s), wherein at least one of the segments comprises a wavelength-converting material for converting light emitted from the LED chip(s) to a certain wavelength.

2. An LED module according to claim 1, wherein the first segment comprises a first wavelength-converting material for converting light emitted from the LED chip(s) to a first wavelength and the second segment comprises a second wavelength-converting material for converting light emitted from the LED chip(s) to a second wavelength.

3. An LED module according to claim 2, wherein the ceramic conversion plate further includes a third segment provided alongside the first and/or second segments covering a third portion of the light emitting surface of the LED chip(s), and wherein the third segment comprises a third wavelength-converting material for converting light emitted from the LED chip(s) to a third wavelength, or a non wavelength-converting material.

4. An LED module according to claim 1, wherein the first segment comprises a first wavelength-converting material for converting light emitted from the LED chip(s) to a first wavelength and the second segment comprises a non wavelength-converting material.

5. An LED module according to claim 1, wherein at least one of the lateral positions of the conversion plate in relation to the LED chip(s) and the size of the segments is selected so that the LED module produces mixed light of a certain desired color.

6. A ceramic conversion plate for use in a light emitting diode (LED) module comprising at least one LED chip having a surface for emitting light, the ceramic conversion plate including:
   a first segment adapted to cover a first portion of the light emitting surface of the LED chip(s), and
   a second segment provided alongside the first segment and adapted to cover a second portion of the light emitting surface of the LED chip(s), wherein at least one of the segments comprises a wavelength-converting material for converting light emitted from the LED chip(s) to a certain wavelength.

7. A ceramic conversion plate to claim 6, further including a third segment provided alongside the first and/or second segments and adapted to cover a third portion of the light emitting surface of the LED chip(s), wherein the third segment comprises a third wavelength-converting material for converting light emitted from the LED chip(s) to a third wavelength, or a non wavelength-converting material.

* * * * *